United States Patent
Fitch et al.

(10) Patent No.: US 11,579,074 B2
(45) Date of Patent: Feb. 14, 2023

(54) ASSESSMENT OF HUMIDITY AND NON-HUMIDITY DRIVEN CORROSION RISK

(71) Applicant: DELL PRODUCTS, LP, Round Rock, TX (US)

(72) Inventors: Jon T. Fitch, Austin, TX (US); Steven Embleton, Austin, TX (US); Sandor Farkas, Round Rock, TX (US); Danny King, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/193,619

(22) Filed: Mar. 5, 2021

(65) Prior Publication Data
US 2022/0283079 A1 Sep. 8, 2022

(51) Int. Cl.
| | | |
|---|---|---|
| G01N 17/04 | (2006.01) | |
| H05K 7/20 | (2006.01) | |
| G06F 1/20 | (2006.01) | |
| G06F 11/30 | (2006.01) | |
| G01N 17/00 | (2006.01) | |
| F24F 11/30 | (2018.01) | |

(52) U.S. Cl.
CPC .............. *G01N 17/04* (2013.01); *F24F 11/30* (2018.01); *G01N 17/00* (2013.01); *G01N 17/043* (2013.01); *G06F 1/206* (2013.01); *G06F 11/3058* (2013.01); *H05K 7/20209* (2013.01); *H05K 7/207* (2013.01); *H05K 7/20836* (2013.01)

(58) Field of Classification Search
CPC ...... G01N 17/04; G01N 17/00; G01N 17/043; F24F 11/30; G06F 1/206; G06F 11/3058; H05K 7/20209; H05K 7/207; H05K 7/20836
See application file for complete search history.

(56) References Cited

U.S. PATENT DOCUMENTS

| | | | |
|---|---|---|---|
| 4,335,072 A * | 6/1982 | Barnett | G01N 17/00 422/53 |
| 9,927,853 B2 | 3/2018 | Vichare et al. | |
| 10,921,300 B2 * | 2/2021 | Alissa | H05K 7/20172 |
| 2009/0236129 A1 | 9/2009 | Schueller et al. | |
| 2010/0076607 A1 * | 3/2010 | Ahmed | G06F 1/206 700/297 |
| 2013/0265064 A1 * | 10/2013 | Hamann | G01N 17/04 324/700 |
| 2014/0078668 A1 * | 3/2014 | Goulden | G06F 1/20 361/679.47 |
| 2015/0268152 A1 * | 9/2015 | Friedersdorf | G01N 33/0031 73/25.01 |
| 2015/0377765 A1 * | 12/2015 | Chilukuri | E21B 47/135 356/73.1 |

(Continued)

FOREIGN PATENT DOCUMENTS

| | | | | |
|---|---|---|---|---|
| EP | 2261546 A1 * | 12/2010 | | F16L 55/00 |
| WO | WO-2010017429 A2 * | 2/2010 | | G06F 1/206 |
| WO | WO-2014018288 A1 * | 1/2014 | | G01N 17/04 |

*Primary Examiner* — Ryan D Walsh
(74) *Attorney, Agent, or Firm* — Larson Newman, LLP

(57) ABSTRACT

An information handling system includes a corrosion controller that may monitor a corrosion sensor array, and determine a type of the corrosion based on a location of a corrosion sensor. The corrosion type may include humidity driven corrosion and non-humidity driven corrosion.

20 Claims, 8 Drawing Sheets

(56) References Cited

U.S. PATENT DOCUMENTS

| | | |
|---|---|---|
| 2017/0089607 A1 | 3/2017 | Vichare et al. |
| 2017/0227451 A1* | 8/2017 | Hoegerl ................. G01N 17/04 |
| 2018/0284011 A1 | 10/2018 | Farkas et al. |
| 2019/0310696 A1* | 10/2019 | Campbell ................ G06F 1/206 |
| 2019/0371367 A1* | 12/2019 | Asmussen ................ G11B 5/40 |
| 2020/0264093 A1* | 8/2020 | Campbell .............. G01N 17/02 |
| 2022/0026870 A1* | 1/2022 | Embleton .............. G01N 17/00 |
| 2022/0027228 A1* | 1/2022 | Embleton ........... G06F 11/0736 |
| 2022/0030750 A1* | 1/2022 | Embleton .......... H05K 7/20836 |

\* cited by examiner

US 11,579,074 B2

ASSESSMENT OF HUMIDITY AND NON-HUMIDITY DRIVEN CORROSION RISK

FIELD OF THE DISCLOSURE

The present disclosure generally relates to information handling systems, and more particularly relates to assessment of humidity and non-humidity driven corrosion risk.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a corrosion controller that may monitor a corrosion sensor array, and determine a type of the corrosion based on a location of a corrosion sensor. The corrosion type may include humidity driven corrosion and non-humidity driven corrosion.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
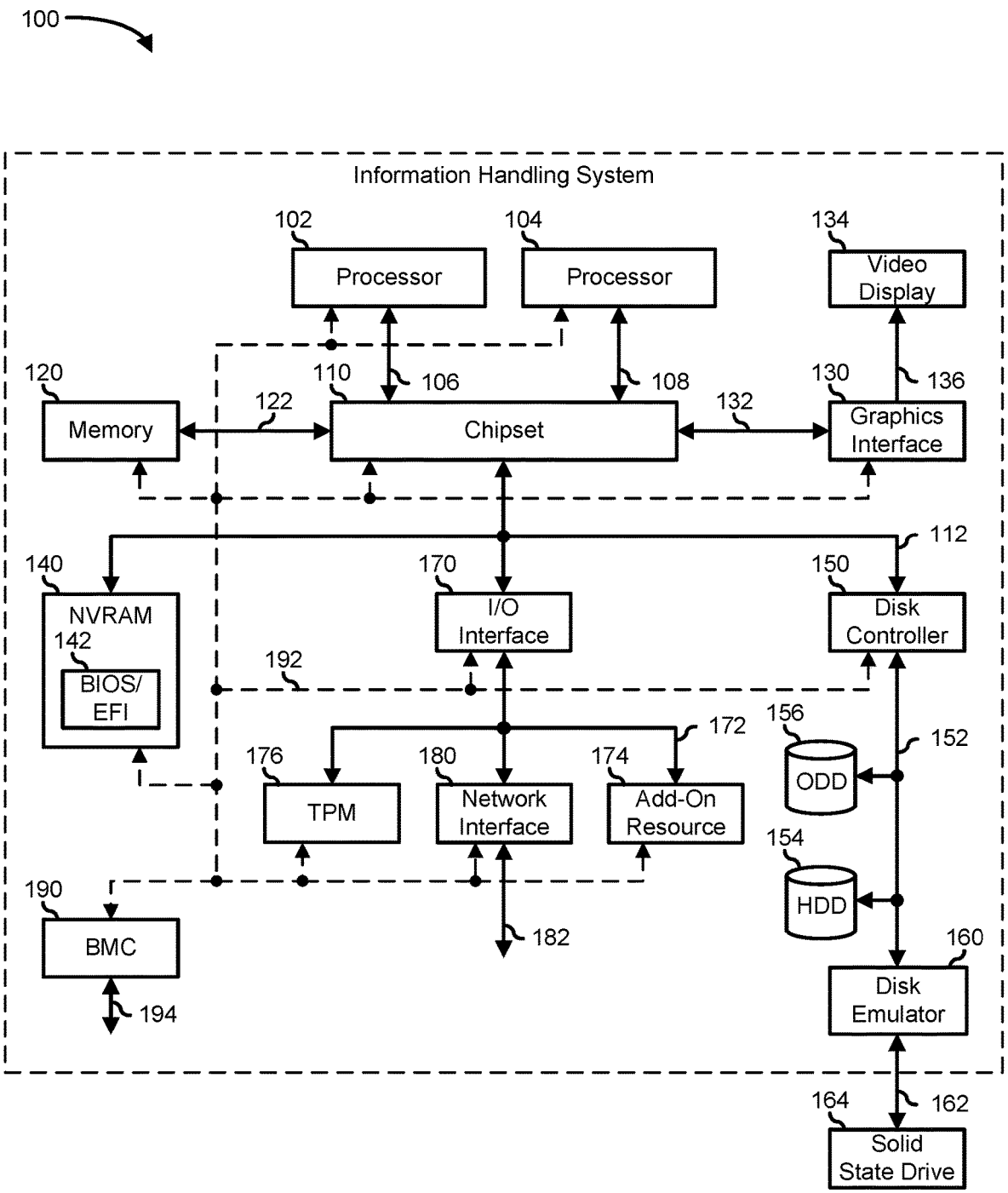
FIG. 1 is a block diagram illustrating an information handling system, according to an embodiment of the present disclosure.

FIG. 1 illustrates an embodiment of an information handling system 100 including processors 102 and 104, a chipset 110, a memory 120, a graphics adapter 130 connected to a video display 134, a non-volatile RAM (NV-RAM) 140 that includes a basic input and output system/extensible firmware interface (BIOS/EFI) module 142, a disk controller 150, a hard disk drive (HDD) 154, an optical disk drive 156, a disk emulator 160 connected to a solid-state drive (SSD) 164, an input/output (I/O) interface 170 connected to an add-on resource 174 and a trusted platform module (TPM) 176, a network interface 180, and a baseboard management controller (BMC) 190. Processor 102 is connected to chipset 110 via processor interface 106, and processor 104 is connected to the chipset via processor interface 108. In a particular embodiment, processors 102 and 104 are connected together via a high-capacity coherent fabric, such as a HyperTransport link, a QuickPath Interconnect, or the like. Chipset 110 represents an integrated circuit or group of integrated circuits that manage the data flow between processors 102 and 104 and the other elements of information handling system 100. In a particular embodiment, chipset 110 represents a pair of integrated circuits, such as a northbridge component and a southbridge component. In another embodiment, some or all of the functions and features of chipset 110 are integrated with one or more of processors 102 and 104.

Memory 120 is connected to chipset 110 via a memory interface 122. An example of memory interface 122 includes a Double Data Rate (DDR) memory channel and memory 120 represents one or more DDR Dual In-Line Memory Modules (DIMMs). In a particular embodiment, memory interface 122 represents two or more DDR channels. In another embodiment, one or more of processors 102 and 104 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 120 may further represent various combinations of memory types, such as Dynamic Random-Access Memory (DRAM) DIMMs, Static Random-Access Memory (SRAM) DIMMs, non-volatile DIMMs (NV-DIMMs), storage class memory devices, Read-Only Memory (ROM) devices, or the like. Graphics adapter 130 is connected to chipset 110 via a graphics interface 132 and provides a video display output 136 to a video display 134. An example of a graphics interface 132 includes a Peripheral Component Interconnect-Express (PCIe) interface and graphics adapter 130 can include a four lane (×4) PCIe adapter, an eight lane (×8) PCIe adapter, a 16-lane (×16) PCIe adapter, or another configuration, as needed or desired. In a particular embodiment, graphics adapter 130 is provided down on a system printed circuit board (PCB). Video display output 136 can include a Digital Video Interface (DVI), a High-Definition Multimedia Interface (HDMI), a DisplayPort interface, or the like, and video display 134 can include a monitor, a smart television, an embedded display such as a laptop computer display, or the like.

NV-RAM 140, disk controller 150, and I/O interface 170 are connected to chipset 110 via an I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including a PCIe interface, an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits SSD 164 to be connected to information handling system 100 via an external interface 162. An example of external interface 162 includes a USB interface, an institute of electrical and electronics engineers (IEEE) 1394 (Firewire) interface, a proprietary interface, or a combination thereof. Alternatively, SSD 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112 or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral interface 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a network communication device disposed within information handling system 100, on a main circuit board of the information handling system, integrated onto another component such as chipset 110, in another suitable location, or a combination thereof. Network interface 180 includes a network channel 182 that provides an interface to devices that are external to information handling system 100. In a particular embodiment, network channel 182 is of a different type than peripheral interface 172 and network interface 180 translates information from a format suitable to the peripheral channel to a format suitable to external devices.

In a particular embodiment, network interface 180 includes a NIC or host bus adapter (HBA), and an example of network channel 182 includes an InfiniBand channel, a Fibre Channel, a Gigabit Ethernet channel, a proprietary channel architecture, or a combination thereof. In another embodiment, network interface 180 includes a wireless communication interface, and network channel 182 includes a Wi-Fi channel, a near-field communication (NFC) channel, a Bluetooth® or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out of band monitoring, maintenance, and control of the elements of the information handling system. As such, BMC 190 represents a processing device different from processor 102 and processor 104, which provides various management functions for information handling system 100. For example, BMC 190 may be responsible for power management, cooling management, and the like. The term BMC is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 190 can vary considerably based on the type of information handling system. BMC 190 can operate in accordance with an Intelligent Platform Management Interface (IPMI). Examples of BMC 190 include an Integrated Dell® Remote Access Controller (iDRAC).

Management interface 192 represents one or more out-of-band communication interfaces between BMC 190 and the elements of information handling system 100, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a Peripheral Component Interconnect-Express (PCIe) interface, a Network Controller Sideband Interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

BMC 190 operates to monitor and maintain system firmware, such as code stored in BIOS/EFI module 142, option ROMs for graphics adapter 130, disk controller 150, add-on resource 174, network interface 180, or other elements of information handling system 100, as needed or desired. In particular, BMC 190 includes a network interface 194 that can be connected to a remote management system to receive firmware updates, as needed or desired. Here, BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 190, an interface defined by the Distributed Management Taskforce (DMTF) (such as a Web Services Management (WSMan) interface, a Management Component Transport Protocol (MCTP) or, a Redfish® interface), various vendor defined interfaces (such as a Dell EMC Remote Access Controller Administrator (RACADM) utility, a Dell EMC OpenManage Enterprise, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100 or is integrated onto another element of the information handling system such as chipset 110, or another suitable element, as needed or desired. As such, BMC 190 can be part of an integrated circuit or a chipset within information handling system 100. An example of BMC 190 includes an iDRAC, or the like. BMC 190 may operate on a separate power plane from other resources in information handling system 100. Thus BMC 190 can communicate with the management system via network interface 194 while the resources of information handling system 100 are powered off. Here, information can be sent from the management system to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

Information handling system 100 can include additional components and additional busses, not shown for clarity. For example, information handling system 100 can include multiple processor cores, audio devices, and the like. While a particular arrangement of bus technologies and interconnections is illustrated for the purpose of example, one of skill will appreciate that the techniques disclosed herein are applicable to other system architectures. Information handling system 100 can include multiple central processing units (CPUs) and redundant bus controllers. One or more components can be integrated together. Information handling system 100 can include additional buses and bus protocols, for example, I2C and the like. Additional components of information handling system 100 can include one or more storage devices that can store machine-executable code, one or more communications ports for communicating with external devices, and various input and output (I/O) devices, such as a keyboard, a mouse, and a video display.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as processor 102, a programmable logic array (PLA), an embedded device such as a System-on-a-Chip (SoC), or other control logic hardware. Information handling system 100 can also include one or more computer-readable media for storing machine-executable code, such as software or data.

Corrosion type includes humidity driven corrosion and non-humidity driven corrosion. Typically, corrosion sensors tell the user that corrosion is detected. However, the corrosion sensors generally do not provide additional information such as the type of corrosion. This presents an issue when mitigating the detected corrosion because there are different control strategies for mitigating different corrosion types. To mitigate humidity driven corrosion, the air temperature may be raised in the chassis by reducing the fan speed, while non-humidity driven corrosion may be mitigated by using chemical to filter incoming air and/or reducing the fan speed. To address the above and other concerns, the present disclosure implements a system and method to act as an early warning system to detect and mitigate corrosion based on the corrosion type and prevent the information handling system from failing.

Figure 2:
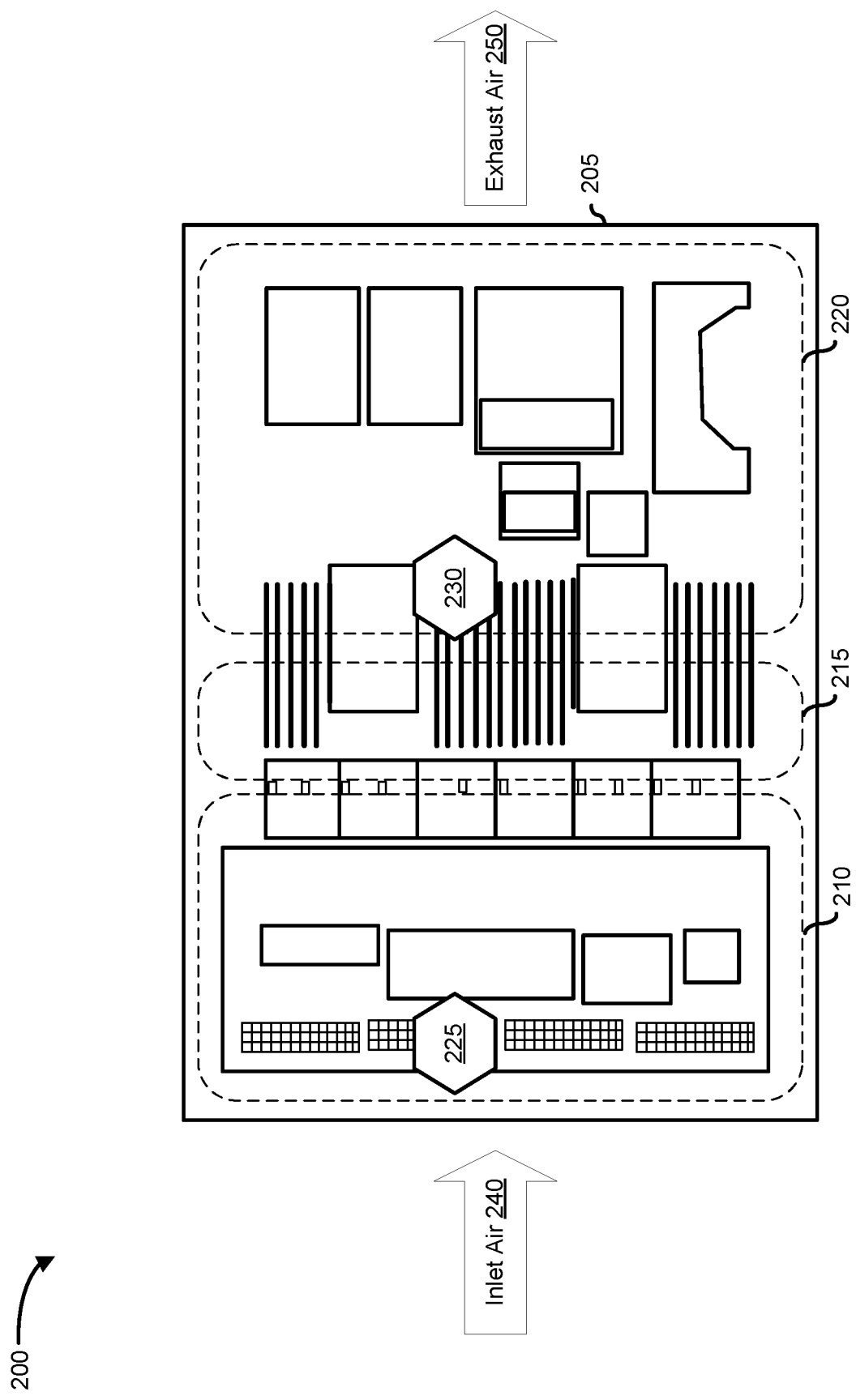
FIGS. 2-5 are block diagrams illustrating an environment for the assessment of humidity and non-humidity driven corrosion risk, according to an embodiment of the present disclosure.

FIG. 2 shows a block diagram of an environment 200 for measurement of humidity and non-humidity driven corrosion. Environment 200 includes a corrosion sensor 225 and a corrosion sensor 230 placed within the chassis of an information handling system 205 which is similar to information handling system 100 of FIG. 1. Environment 200 includes a layout view of corrosion sensor placement among components of information handling system 205. The components shown are not drawn to scale and environment 200 may include additional or fewer components. In addition, connections between components and/or the corrosion sensors may be omitted for clarity.

Environment 200 may be divided into two or more zones based on relative humidity and/or temperature level. In this example, environment 200 is divided into three zones: a zone 210, a zone 215, and a zone 220. Typically, zone 210 is located toward the front end of the chassis of information handling system 205. Typically, zone 220 is located toward the rear end of the chassis of information handling system 205 while zone 215 is located in between zone 210 and zone 220. Although zone 220 is shown as toward the rear end of the chassis of information handling system 205, zone 220 may be located anywhere in the chassis as long as it is in a lower humidity location in comparison with the humidity levels of zone 220 and zone 215. The humidity and temperature levels may be pre-defined. For example, zone 210 may include an area where the relative humidity is above 60% while zone 215 includes an area where the relative humidity is greater than 50% and less than 60%. Accordingly, zone 220 may include an area where the relative humidity is less than 50%. Zone 210 may be classified as high humidity zone while zone 220 may be classified as low humidity zone and zone 215 as mid humidity zone.

Environment 200 includes two corrosion sensors working in tandem. Corrosion sensor 225, also referred herein as a front sensor, may be located towards the front end of the chassis of information handling system 205. Corrosion sensor 230, also referred herein as a rear sensor, may be located towards the rear end of the chassis of information handling system 205. Corrosion sensor 225 may be located in zone 210 and corrosion sensor 230 may be located in zone 220. In particular, the rear sensor may be located in a zone with a relative humidity of 50% or less. Conversely, the front sensor may be located in a zone with a relative humidity of greater than 50%.

Corrosion sensor 225 and corrosion sensor 230 may be configured to detect corrosion events that occur to corrosion-sensitive components, such as exposed electronic circuits. The corrosion events may be based on various corrosive conditions that corrosion sensor 225 and/or corrosion sensor 230 are exposed to, such as contaminants, humidity, particulates, pollutants, etc. as well as varying temperatures. Corrosion events include changes to temperature, humidity, air flow, corrosion rate, extent corrosion or corrosion level. Corrosion sensor 225 and corrosion sensor 230 may be configured to detect both humidity driven and non-humidity driven corrosion. Corrosion sensor 225 and corrosion sensor 230 may detect corrosion events on a continuous basis or during a desired time interval(s).

Corrosion sensor 225 and corrosion sensor 230 may take measurements associated with corrosion of one or more components of information handling system 205. Corrosion sensor 225 and corrosion sensor 230 may be configured to work in tandem in the measurement of humidity driven and non-humidity driven corrosion and corrosion rates. Corrosion rate is a function of several variables such as relative humidity, air flow, and the location of the corrosion, such as distance of the corrosion from the rear of the chassis. Humidity driven corrosion rate may be equal to the corrosion rate determined via the front sensor less the corrosion rate determined via the rear sensor. Non-humidity driven corrosion rate may be equal to the corrosion rate determined via the rear sensor.

Environment 200 may include a corrosion controller configured to monitor and manage corrosion within information handling system 205. The corrosion controller may determine additional information associated with the corrosion, such as corrosion level, location of the corrosion, location of the corrosion sensor, extent of the corrosion, corrosion rate, type of corrosion, etc. based the measurements or information from corrosion sensor 225 and corrosion sensor 230. In particular, the corrosion controller may determine the corrosion type such as whether the corrosion is humidity driven corrosion or non-humidity driven corrosion. Humidity driven corrosion is dependent on relative humidity and typically occurs in the front end of the chassis where it is more humid than the rear end of the chassis. On the other hand, non-humidity driven corrosion is not dependent on the relative humidity and can occur anywhere in the chassis. The corrosion level of non-humidity driven corrosion can be the same in the front end and the rear end of the chassis.

Information handling system 205 may include a corrosion controller configured to determine whether to perform one or more mitigating action based on various factors such as the corrosion level, location of the corrosion, corrosion risk, corrosion type, etc. The corrosion controller may apply one or more rules on empirical data to determine the additional information associated with the corrosion and the mitigating action. The mitigating action may include modulating the humidity, adjusting the cooling system and/or air flow, etc. The corrosion controller may be implemented in hardware, software, firmware, or any combination thereof. The controller may be a separate component or set of instructions or may be integrated with other components or executed by a CPU. For example, corrosion controller may be an embedded controller, such as BMC 190. Corrosion controller may be used to monitor electronic component corrosion rate, determine whether a condition exceeds a threshold such as when the corrosion exceeds a predetermined corrosion rate. In one particular example, the corrosion controller may determine how much heat is allowed, such as via a temperature threshold. Based on the aforementioned determination the corrosion controller may monitor and/or manage the fan speed, such as increasing, decreasing, and/or maintaining the current fan speed to reduce the chance of corrosion.

In order to mitigate and/or protect information handling system 205 from corrosion, the corrosion controller may need to maintain a particular temperature and/or humidity thresholds. If the temperature is greater than a temperature threshold, then the fan speed may be increased so that more air flows through information handling system 205 which lowers its temperature. Also, if the humidity level is greater than a humidity threshold, then the fan speed may be decreased so that less air flows through information handling system 205 which increases its temperature. In addition, the corrosion controller may send a notification to a user or administrator, where the notification may include information such as location, risk, and level of the corrosion and/or whether failure of a particular component is imminent or not. The monitoring and/or management of corrosion disclosed herein may allow for enough lead time for automated and/or manual mitigation processes and or activities to prevent or delay information technology (IT) equipment damage and/or failure. Accordingly, the benefit of monitoring and/or managing the corrosion of an information handling system disclosed is the prevention of IT equipment damage and/or failure as opposed to the user having to perform drastic actions if catastrophic IT equipment damage or failure is imminent.

Figure 3:
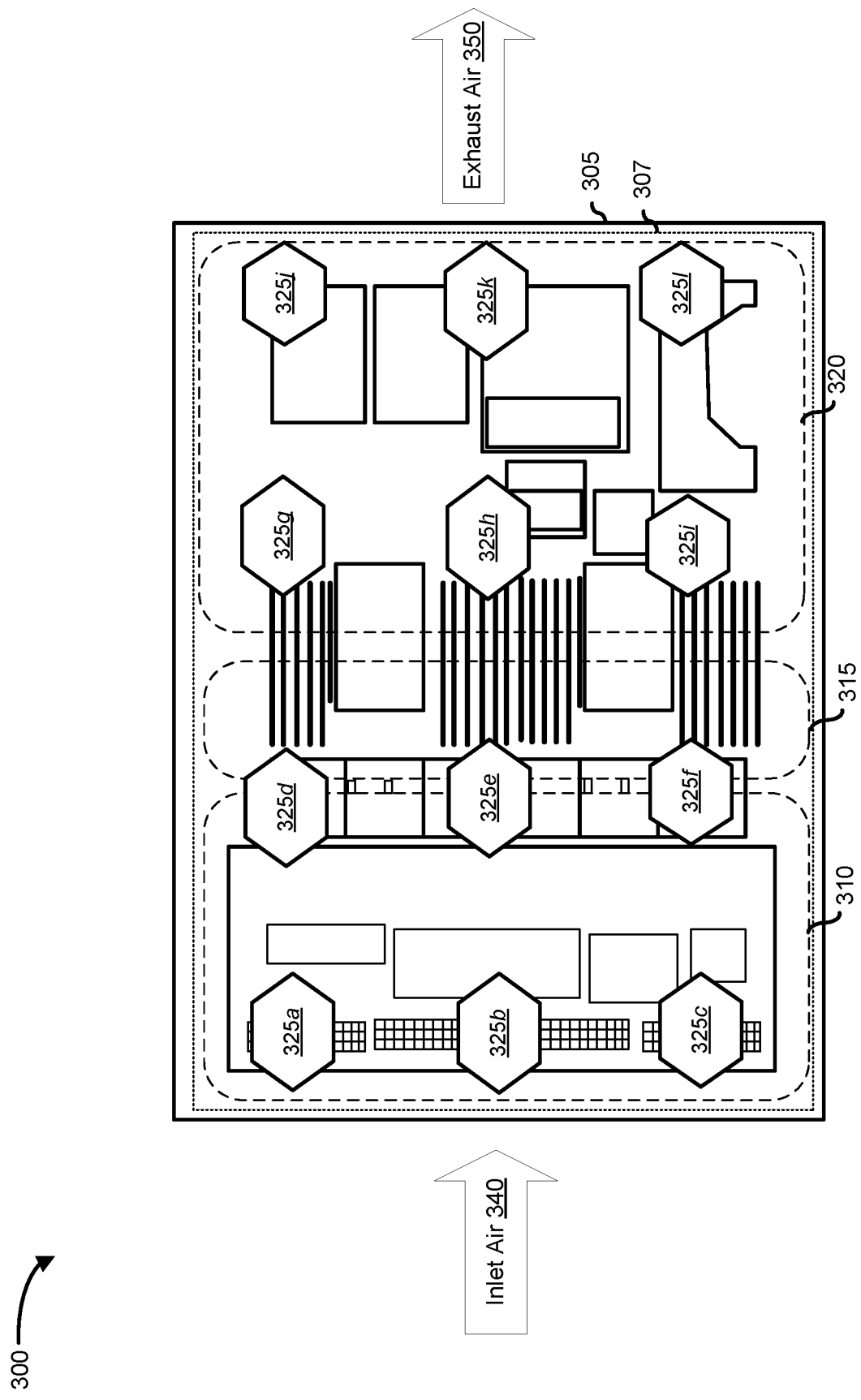

FIG. 3 shows a block diagram of an environment 300 for assessment of humidity and non-humidity driven corrosion. Environment 300 includes a corrosion sensor array 307 with a plurality of corrosion sensors 325a-325l placed in an information handling system 305 which is similar to information handling system 205 of FIG. 2. Environment 200 also includes inlet air 340 that passes through information handling system 305 and goes out as exhaust air 350. The components shown are not drawn to scale and environment 300 may include additional or fewer components. In addition, connections between components and/or corrosion sensors may be omitted for clarity.

Similar to information handling system 205, information handling system 305 may include three zones: a zone 310, a zone 315, and a zone 320. Zone 310 is similar to zone 210 while zone 315 is similar to zone 215 and zone 320 similar to zone 220. Instead of having two corrosion sensors, an array of corrosion sensors, such as corrosion sensors 325a-325l, are arranged in a grid like pattern. The array of corrosion sensors may include a set of front corrosion sensors, mid corrosion sensors, and rear corrosion sensors.

In one embodiment, corrosion sensors 325d-325f may be included in the set of front corrosion sensors while corrosion sensors 325g-325l may be included in the set of rear corrosion sensors. The corrosion sensors may be arranged in an equidistant fashion.

The function of the corrosion sensors 325a-325l are similar to the functions of corrosion sensor 225 and corrosion sensor 230 of FIG. 2. Here, there are twelve corrosion sensors in this example, the number of corrosion sensors may be more or less than the number of corrosion sensors shown. Although, the corrosion sensors are shown to be arranged in a grid pattern, the corrosion sensors may be also arranged based on the location of the components of information handling system 305. For example, each of the corrosion sensors in the corrosion sensor array may be placed in proximity to a component based on one or more factors, such whether the component is prone to corrosion and/or its risk of failure when corroded. For example, a corrosion sensor may be used to monitor a hard drive of information handling system 305 and would thus be placed in proximity to the hard drive. Accordingly, a corrosion sensor may be used to monitor other components that commonly fail when corroded such as graphic cards, capacitors, motherboards, DIMMs, transistors, etc.

Information handling system 305 may also include a corrosion controller similar to the corrosion controller of FIG. 2. For example, based on the location of a corrosion sensor, the corrosion controller may determine the location and type of the corrosion detected. The information associated with the location of the corrosion can be based on relative location, cell, and zone associated with the corrosion sensor. Further, a "corrosion map" similar to corrosion map 700 of FIG. 7 may be generated. The placement of the corrosion sensors may help identify the weakest link that is the components that are most susceptible to corrosion and guard against component failure. For example, corrosion protection protocol, also referred herein as corrosion mitigation procedure, may be implemented to increase, or decrease humidity and/or temperature accordingly.

Component corrosion threshold values and location within information handling system 305 may be identified. These values when compared to the corrosion map are used to determine when to implement the corrosion protection protocol. The corrosion map allows the corrosion controller to identify discrete corrosion concerns as opposed to using the conservative approach and assuming maximum corrosion across the entire information handling system. This allows for energy savings and increased performance by implementing a corrosion response protocol judiciously.

Figure 4:
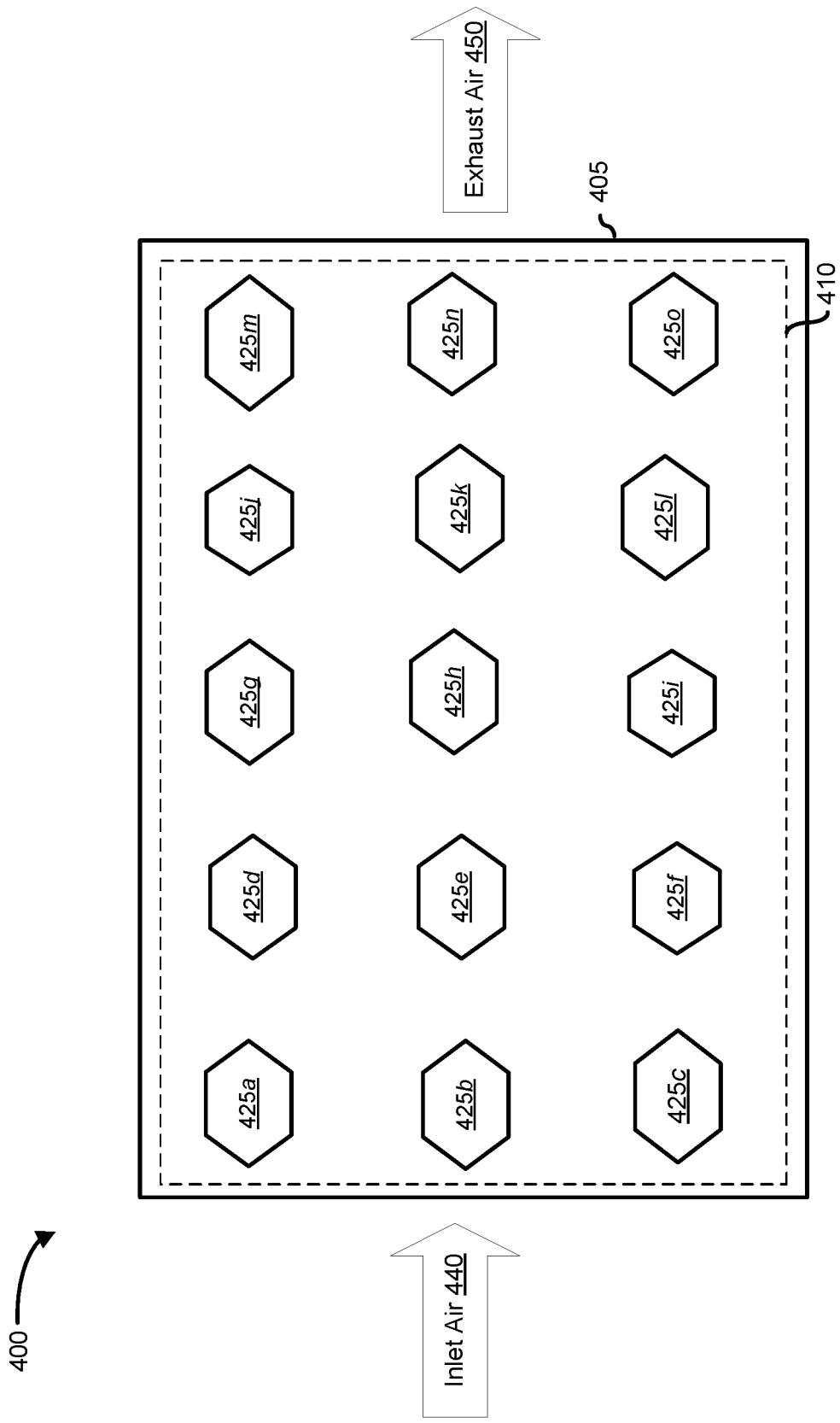

FIG. 4 shows a block diagram of an environment 400 for assessment of humidity and non-humidity driven corrosion in an information handling system. Environment 400, which is similar to environment 300, includes a lid 405, a corrosion sensor array 410, inlet air 440, and exhaust air 450. Similar to corrosion sensor array 307, corrosion sensor array 410 includes a plurality of two-dimensionally arranged corrosion sensors 425a-425o. Corrosion sensor array 410 may include additional or fewer corrosion sensors. Connections between the corrosion sensors and/or other components may be omitted for clarity.

Corrosion sensors 425a-425o may be arranged in a grid like pattern on lid 405 of a chassis of an information handling system. The functionality of corrosion sensors 425o-425o may be similar to the functionality of corrosion sensors 325o-325l of FIG. 3, wherein instead of corrosion sensors 425a-425o arranged in the chassis of an information handling system, corrosion sensors 425a-425o are placed in the chassis. Corrosion sensors 425a-425o may be communicatively coupled to a corrosion controller which monitors and manages corrosion similar to the corrosion controller of FIG. 3.

Figure 5:
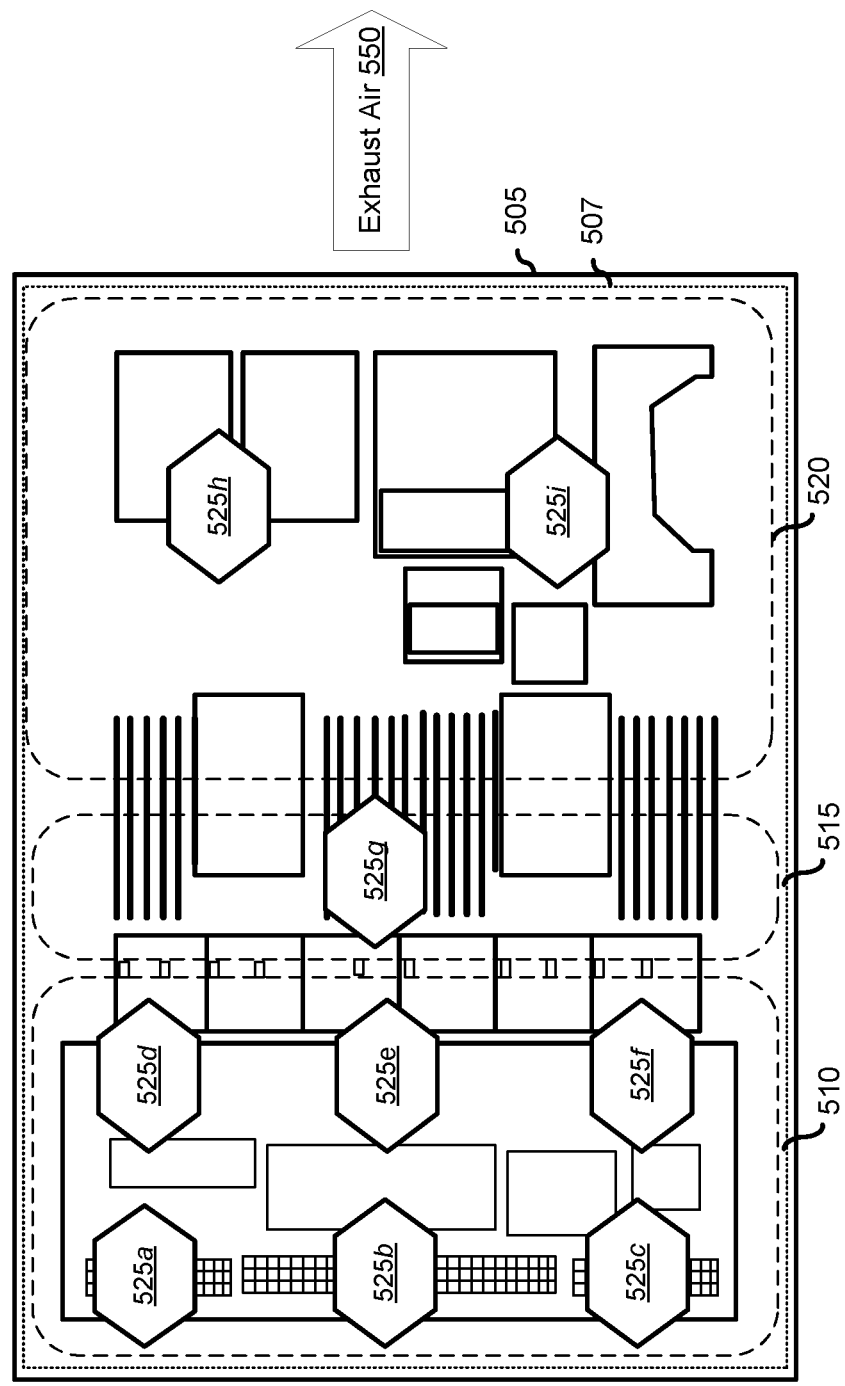

FIG. 5 shows a block diagram of an environment 500 for assessment of humidity and non-humidity driven corrosion. Environment 500 includes a plurality of corrosion sensors 525a-525i placed in an information handling system 505 which is similar to environment 300 of FIG. 3. Environment 500 also includes inlet air 540 passing through information handling system 505 and goes out as exhaust air 550. The components shown are not drawn to scale and environment 300 may include additional or fewer components. In additional connections between components and/or sensor may be omitted for clarity.

Similar to information handling system 305, information handling system 505 may include three zones: a zone 510, a zone 515, and a zone 520. Zone 510 is similar to zone 310 while zone 515 is similar to zone 315 and zone 520 similar to zone 320. Here, several corrosion sensors included in a corrosion sensor array 507, such as a corrosion sensor 525a-corrosion sensor 325g. The corrosion sensors are arranged in a grid like pattern over the zones and have the same functionality as the corrosion sensors of FIG. 3. Although, there are seven corrosion sensors in this example, the number of corrosion sensors may be more or less than the number of corrosion sensors shown. Here, the corrosion sensors are arranged according to a pattern that is based on the location of the components of information handling system 305. For example, the corrosion sensors may be placed in proximity to a pre-identified component based on one or more factors, such whether the component is prone to corrosion and/or its risk of failure when corroded. In addition, the pattern and/or number of corrosion sensors may be based on other factors such as the form factor of the information handling system. The specific pattern may be determined during the manufacture of the information handling system and applied to a particular stock keeping unit. Similar to information handling system 305, information handling system 505 also includes a corrosion controller which is similar to the corrosion controller of FIG. 3, such as the corrosion controller may be configured to monitor and manage the corrosion of information handling system 505.

Figure 6:
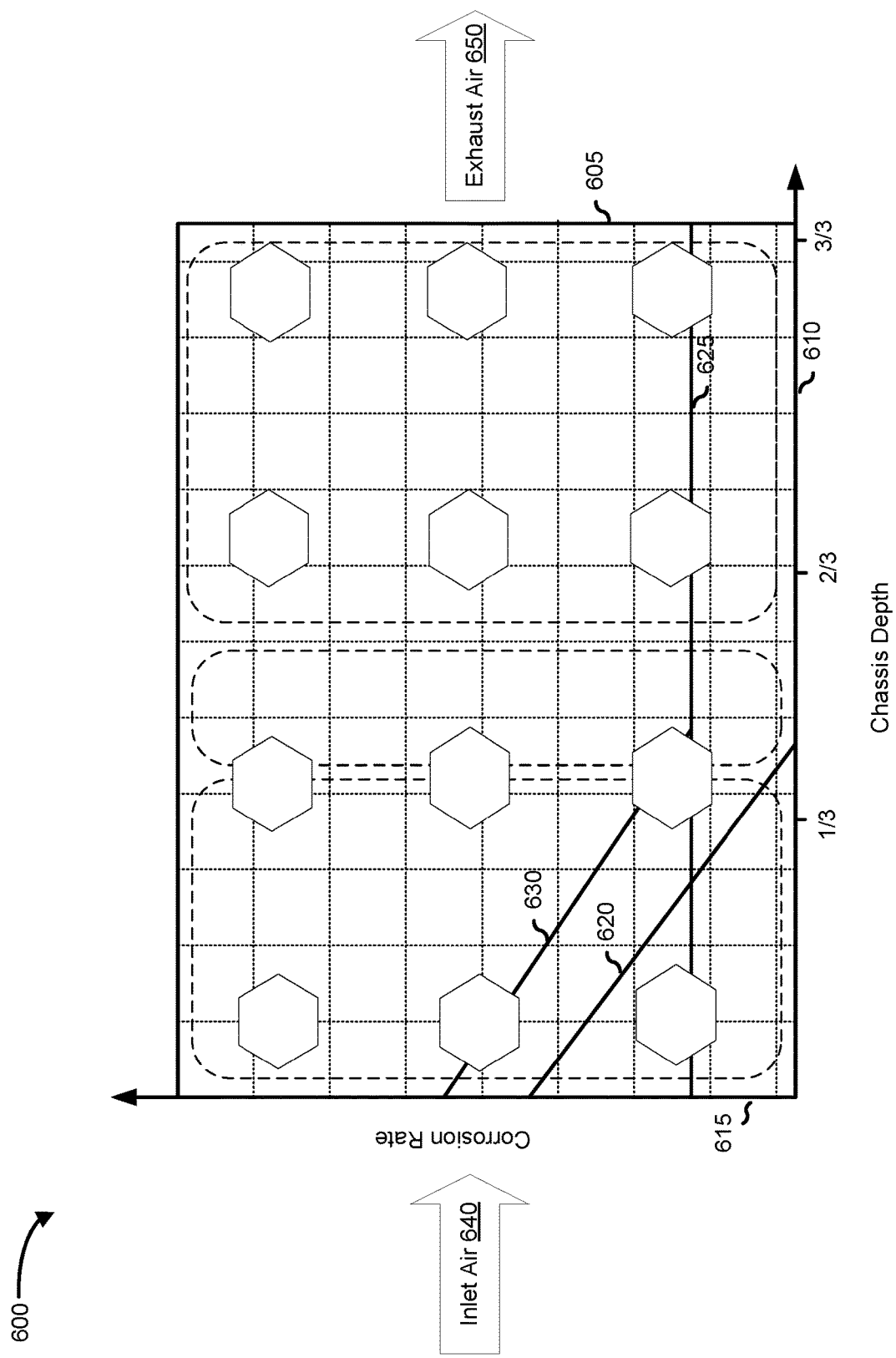
FIG. 6 is a graph illustrating example corrosion rates, according to an embodiment of the present disclosure.

FIG. 6 shows a diagram of a corrosion graph 600 that depicts corrosion rate relative to chassis depth. A vertical axis 615 represents the corrosion rate and a horizontal axis 610 represents a depth of a chassis of an information handling system 605. Corrosion graph 600 includes a line 620, a line 625, and a line 630. Inlet air 640, which is typically used to cool information handling system 605, goes in the front of information handling system 605 and is generally humid. Accordingly, humidity driven corrosion is greater towards the front of the chassis and decreases with increase in chassis depth. Line 620 represents the rate of humidity driven corrosion relative to the depth of the chassis. As shown, the corrosion rate of humidity driven corrosion decreases as the depth of the chassis increases. Here, line 620 drops to zero just a little past a third of the chassis length, wherein relative humidity is typically at 50%. Accordingly, corrosion detected by corrosion sensors at the front of the chassis typically includes humidity driven and non-humidity driven corrosion.

As inlet air 640 passes through the chassis and comes out at the back as exhaust air 650, the temperature increases and correspondingly relative humidity goes down. Typically, humidity driven corrosion is not seen at the back of the chassis where the humidity level is at around 50% relative humidity or less. Accordingly, corrosion detected by corrosion sensors at the back of the chassis is typically non-humidity driven corrosion. Corrosion detected toward the middle of the chassis may include humidity and non-humidity driven corrosion. Line 625 represents the rate of non-humidity type corrosion relative to the depth of the chassis. Because humidity does not affect non-humidity driven corrosion, the corrosion rate of non-humidity driven corrosion remains constant at varying depths of the chassis. Line 630 represents the total rate of corrosion, which includes the corrosion rate of the humidity driven and non-humidity driven corrosion. As shown, the total corrosion rate is greater at the front of the chassis and decreases as the depth of the chassis increases.

Figure 7:
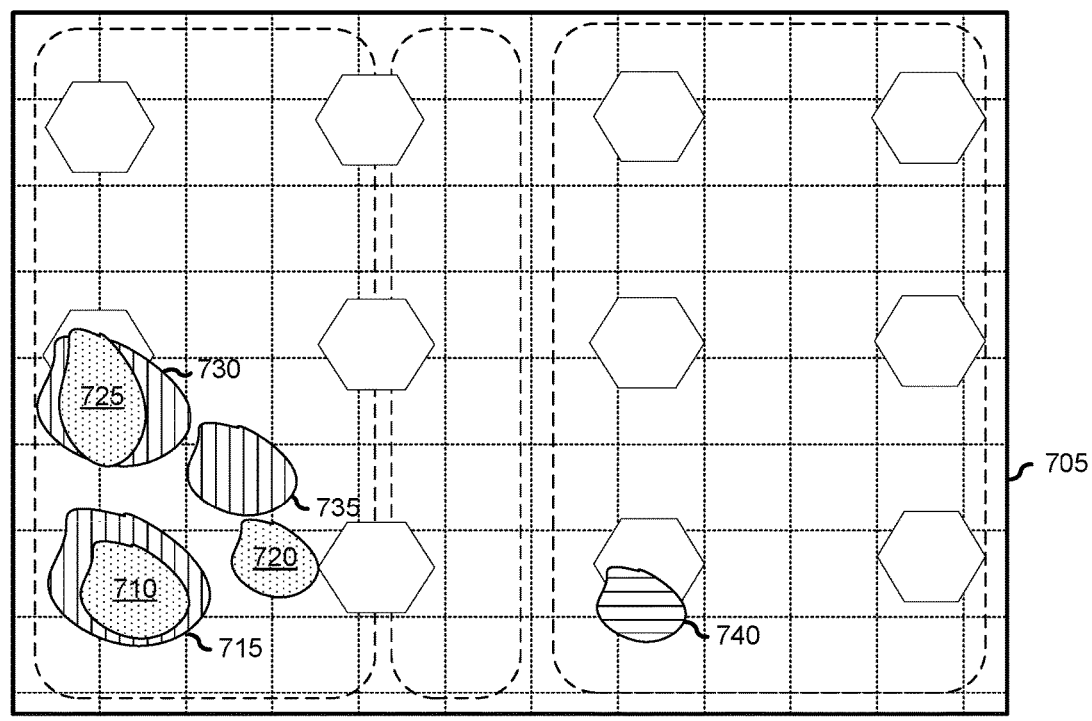
FIG. 7 is a diagram illustrating an example of a corrosion map, according to an embodiment of the present disclosure.

FIG. 7 shows a diagram of a corrosion map 700 that depicts corrosion detected in an information handling system 705. Corrosion map 700 may also depict the degree or level of the detected corrosion. A corrosion controller may automatically classify corrosion detected by one or more corrosion sensors according to corrosion level and/or corrosion type. The corrosion map may be used a visualization tool for displaying corrosion levels. Each corrosion level may be depicted and distinguished from each other using varying degree of shade, pattern, color, etc. In this example, areas with high level of corrosion, such as a corrosion 710, corrosion 720, and corrosion 725, have a different pattern compared to areas with a moderate level of corrosion such as a corrosion 715, corrosion 730, corrosion 735, and corrosion 740.

Corrosion map 700 may also be used as a visualization tool for displaying the corrosion type. For example, the humidity driven corrosion which may be determined by the delta between the non-humidity driven corrosion from the total corrosion detected in information handling system 705. In another example, the corrosion type may be determined based on the location of the corrosion and/or the corrosion sensor in the chassis of information handling system 705. Here, corrosion 740 may be classified as non-humidity driven corrosion because of its location towards the rear of the chassis, which typically has less than 50% relative humidity. In yet another example, there may be a different corrosion map for each corrosion type, such as a first corrosion map may show humidity corrosion and a second corrosion map may show non-humidity corrosion. The first corrosion map and the second corrosion map may also show the corrosion level of the shown corrosion types.

Figure 8:
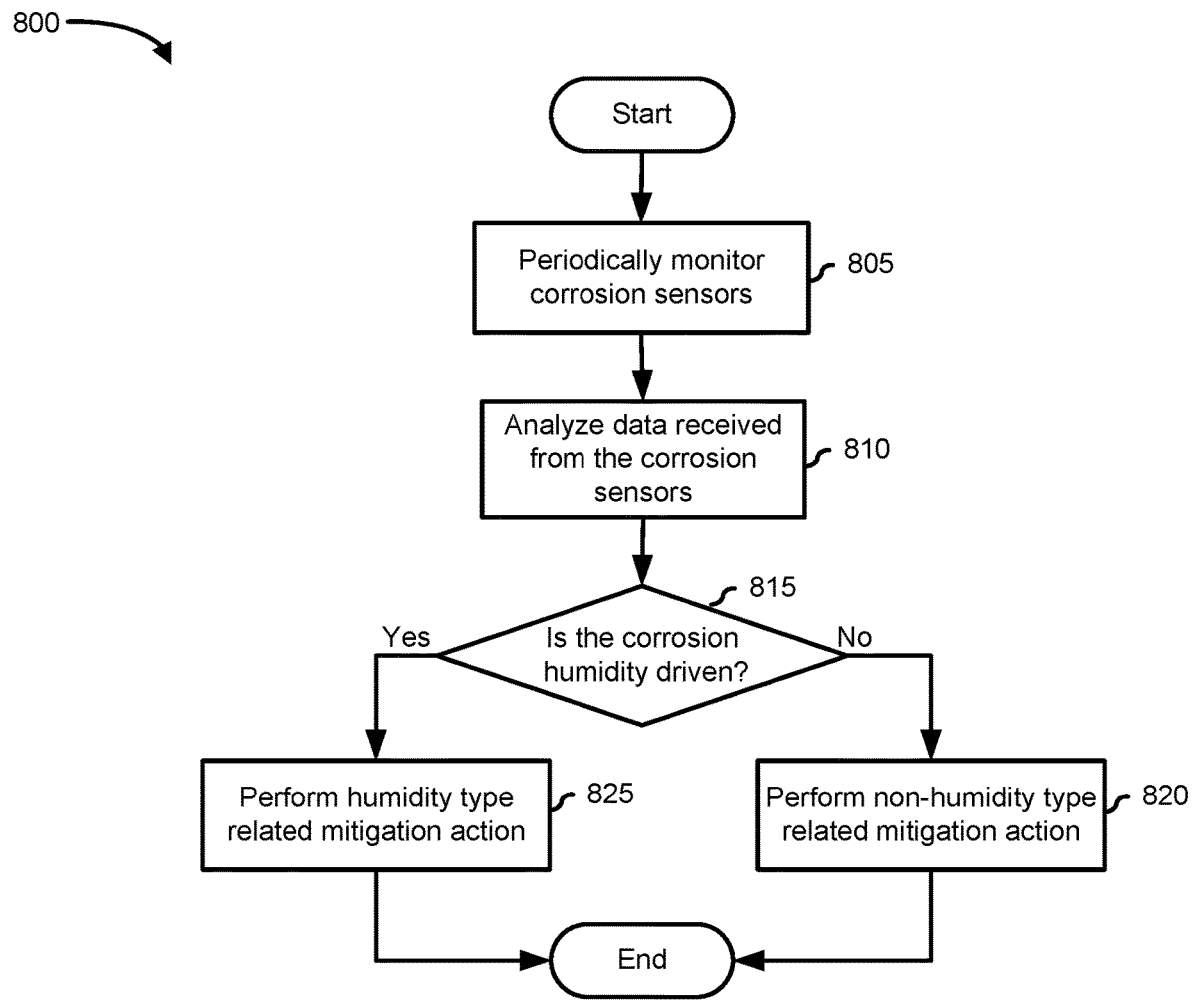
FIG. 8 is a flowchart illustrating a method for assessment of humidity and non-humidity driven corrosion risk, according to an embodiment of the present disclosure.

FIG. 8 shows a flowchart of an example method 800 for assessment of humidity and non-humidity driven corrosion risk. Method 800 may be performed by one or more components of the aforementioned figures such as a corrosion controller and/or corrosion sensors. While embodiments of the present disclosure are described in terms of the various environments, it should be recognized that other systems may be utilized to perform the described method. One of skill in the art will appreciate that this flowchart explains a typical example, which can be extended to advanced applications or services in practice.

Method 800 typically starts at block 805 where corrosion sensors, which may be included in a corrosion sensor array, are periodically monitored by a corrosion controller. The corrosion controller can be an embedded controller, such as BMC 190. The corrosion controller can receive or retrieve current corrosion information from one or more corrosion sensors. The corrosion sensor information can be received and/or collected at various intervals such as once a minute, once every ten minutes, etc. In one embodiment, one or more of the corrosion sensors can issue an interrupt or activate an indicator to alert the corrosion controller when there is a corrosion event, such as a change in the corrosion rate. For example, a corrosion event may be triggered when the corrosion rate exceeds a particular threshold. An array of corrosion sensors may be used to create a "corrosion map" to monitor and/or manage corrosion at one or more locations in the information handling system and identify the "weakest link". The corrosion map would allow determination of discrete corrosion concerns as opposed to using assuming that there is corrosion across the entire information handling system, which allows for targeted corrosion response protocol.

The method proceeds to block 810 where the information received and/or collected is analyzed. For example, the method determines the corrosion type, corrosion rate, location of the corrosion, etc. The analysis may be performed by the corrosion controller, a CPU of the information handling system, or by another processor. A decision on whether to perform mitigating procedure when corrosion is detected may be determined. Such decision may be based on the corrosion risk, which may also be determined based on current and accumulated empirical data. In particular, the corrosion risk may be determined by combining the corrosion level of a component along with its corrosion tolerance. The location of the detected corrosion and/or the location of the corrosion sensor that detected the corrosion may also be used to determine the corrosion risk. For example, the corrosion risk may be higher if the corrosion detected is associated with the components that typically fail when corrosion is detected. The corrosion risk may then be used to implement a corrosion mitigation strategy or procedure that is particular to the corrosion type and/or component. In addition, the corrosion mitigation procedure may be applied discretely to the location of the corrosion or the component which is more efficient and effective than the traditional mitigation procedure.

The method proceeds to decision block 815 where a determination is made regarding the type of corrosion detected. If the corrosion detected is humidity driven corrosion, then the "YES" branch is taken and the method proceeds to block 825. If the corrosion detected is non-humidity driven corrosion, then the "NO" branch is taken and the method proceeds to block 820. At block 820, a non-humidity driven corrosion mitigation procedure may be applied. In one example, because sulfur corrosion is driven by the rate of air flow, if it is determined that the corrosion is sulfur related then the air flow rate may be reduced to decrease the rate of sulfur corrosion. In another example, the non-humidity driven corrosion mitigation procedure may include adjusting the environment of the information handling system such that corrosion rates are maintained within the following recommendation of the American Society of Heating, Refrigerating and Air-conditioning Engineers (ASHRAE): copper reactivity rate of less than three hundred angstroms per month and silver reactivity rate of less than two hundred angstroms per month. In yet another example, a notification may be sent to a user to alert the user regarding the detected corrosion.

At block 825, a humidity driven corrosion mitigation procedure may be performed. The humidity may be modulated by increasing or decreasing the air flow rate, which may also adjust the corrosion point of the information handling system. For example, if the air flow rate is increased, there may be a smaller temperature rise in the chassis which increases the relative humidity level. This in turn pushes the humidity driven zero-corrosion point towards the rear of the chassis. Conversely if the air flow rate is decreased, there may be a bigger temperature rise in the chassis which decreases the relative humidity level. This in turn moves the humidity driven zero-corrosion point towards the front of the chassis.

Although FIG. 8 show example blocks of method 800 in some implementation, method 800 may include additional blocks, fewer blocks, different blocks, or differently arranged blocks than those depicted in FIG. 8. Additionally, or alternatively, two or more of the blocks of method 800 may be performed in parallel. For example, block 805 may be performed while analyzing previous corrosion data received and/or collected at block 810.

While specific examples of corrosion sensor configuration have been illustrated and described above, one of skill in the art in possession of the present disclosure will recognize other corrosion sensors configurations may be provided that will fall within the scope of the present disclosure. For example, although corrosion sensors here are distributed from the front to the rear of the chassis, in another embodiment the sensors may be distributed from right to left or left to right. In addition, the functionality associated with the monitoring and managing of the corrosion in the information handling system may be similar in spite of the differences in the configuration of the corrosion sensors. In some embodiments, the corrosion mitigation protocol may be based on the distribution of the corrosion sensors. For example, the corrosion protection protocol may be implemented discretely per fan of the information handling system if corrosion risks vary from the left to the right of the chassis.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionalities as described herein.

The present disclosure contemplates a non-transitory computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or another storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A method that infers a corrosion type occurring within a chassis of an information handling system, the method comprising:
   receiving, by a controller, sensory corrosive measurements generated by corrosion sensors operating at different locations within the chassis;
   comparing the sensory corrosive measurements to corrosive threshold levels;
   determining that a sensory corrosive measurement of the sensory corrosive measurements exceeds a corrosive threshold level of the corrosive threshold levels;
   inferring a corrosion in response to the sensory corrosive measurement exceeding the corrosive threshold level;
   determining a corrosion sensor of the corrosion sensors generating the sensory corrosive measurement that exceeds the corrosive threshold level;
   determining a chassis location within the chassis that corresponds to the corrosion sensor;
   determining the corrosion type of the corrosion occurring within the chassis based on the chassis location that corresponds to the corrosion sensor; and
   generating a corrosion alert in response to the corrosion type.

2. The method of claim 1, wherein the receiving of the sensory corrosive measurements generated by the corrosion sensors comprises receiving a temperature measurement.

3. The method of claim 1, wherein the receiving of the sensory corrosive measurements generated by the corrosion sensors comprises receiving a humidity measurement.

4. The method of claim 1, wherein the receiving of the sensory corrosive measurements generated by the corrosion sensors comprises receiving a contaminate measurement.

5. The method of claim 1, wherein the receiving of the sensory corrosive measurements generated by the corrosion sensors comprises receiving a particulate measurement.

6. The method of claim 1, further comprising determining a humidity driven corrosion rate based on the sensory corrosive measurements and the different chassis locations.

7. The method of claim 1, wherein the receiving of the sensory corrosive measurements generated by the corrosion sensors comprises receiving an air flow measurement.

8. The method of claim 1, further comprising determining a non-humidity driven corrosion rate based on the different chassis locations of the corrosion sensors.

9. The method of claim 1, further comprising generating a corrosion map by mapping the sensory corrosive measurements to the different chassis locations corresponding to the corrosion sensors.

10. The method of claim 1, further comprising increasing a fan speed in response to the sensory corrosive measurement that exceeds the corrosive threshold level.

11. The method of claim 1, further comprising determining corrosion risk based on the chassis location that corresponds to the corrosion sensor.

12. The method of claim 1, further comprising determining a hardware component exposed to the corrosion based on the chassis location that corresponds to the corrosion sensor.

13. An information handling system, comprising:
a controller; and
a memory device storing instructions that when executed by the controller perform operations including:
receiving sensory corrosive measurements generated by corrosion sensors operating at different locations within a chassis of the information handling system;
comparing the sensory corrosive measurements to corrosive threshold levels;
determining that a sensory corrosive measurement of the sensory corrosive measurements exceeds a corrosive threshold level of the corrosive threshold levels;
determining a corrosion sensor of the corrosion sensors generating the sensory corrosive measurement that exceeds the corrosive threshold level;
determining a chassis location within the chassis that corresponds to the corrosion sensor;
determining a corrosion type of a corrosion occurring within the chassis based on the chassis location that corresponds to the corrosion sensor; and
generating a corrosion alert in response to the corrosion type.

14. The information handling system of claim 13, wherein the operations further include receiving a temperature measurement generated by at least one of the corrosion sensors.

15. The information handling system of claim 13, wherein the operations further include receiving a humidity measurement generated by at least one of the corrosion sensors.

16. The information handling system of claim 13, wherein the operations further include receiving an air flow measurement generated by at least one of the corrosion sensors.

17. The information handling system of claim 13, wherein the operations further include generating a corrosion map by mapping the sensory corrosive measurements to the different chassis locations corresponding to the corrosion sensors.

18. The information handling system of claim 13, wherein the operations further include increasing a fan speed in response to the sensory corrosive measurement that exceeds the corrosive threshold.

19. The information handling system of claim 13, wherein the operations further include determining a hardware component exposed to the corrosion based on the chassis location that corresponds to the corrosion sensor.

20. A non-transitory memory device storing instructions that when executed perform operations, comprising:
receiving sensory corrosive measurements generated by corrosion sensors operating at different locations within a chassis of an information handling system;
comparing the sensory corrosive measurements to corrosive threshold levels;
determining that a sensory corrosive measurement of the sensory corrosive measurements exceeds a corrosive threshold level of the corrosive threshold levels;
determining a corrosion sensor of the corrosion sensors generating the sensory corrosive measurement that exceeds the corrosive threshold level;
determining a location within the chassis that corresponds to the corrosion sensor;
determining one of a humidity corrosion type or a non-humidity corrosion type of a corrosion occurring within the chassis based on the chassis location that corresponds to the corrosion sensor; and
generating a corrosion alert in response to either of the humidity corrosion type or the non-humidity corrosion type of the corrosion.

\* \* \* \* \*